United States Patent [19]
Haller et al.

[11] Patent Number: 6,144,604
[45] Date of Patent: Nov. 7, 2000

[54] SIMULTANEOUS ADDRESSING USING SINGLE-PORT RAMS

[76] Inventors: Haggai Haim Haller, 22 Alter Street, Ramat Alon, Haifa; Elisha John Ulmer, 18 Hadass Street, Tiberias, both of Israel

[21] Appl. No.: 09/438,251

[22] Filed: Nov. 12, 1999

[51] Int. Cl.[7] ........................................ G11C 7/00
[52] U.S. Cl. ..................... 365/221; 365/233; 365/239; 365/189.07
[58] Field of Search ................... 365/221, 233, 365/239, 189.07

[56] References Cited

U.S. PATENT DOCUMENTS

| | | | |
|---|---|---|---|
| 5,255,239 | 10/1993 | Taborn et al. | 365/221 |
| 5,267,191 | 11/1993 | Simpson | 365/78 |
| 5,371,877 | 12/1994 | Drako | 395/425 |
| 5,544,104 | 8/1996 | Chauvel | 365/189.01 |
| 5,706,482 | 1/1998 | Matsushima et al. | 396/521 |
| 5,802,579 | 9/1998 | Crary | 711/149 |
| 5,818,751 | 10/1998 | Ho et al. | 365/154 |
| 5,912,898 | 6/1999 | Khoury | 371/2.1 |
| 5,982,700 | 11/1999 | Proebsting | 365/230.05 |

OTHER PUBLICATIONS

"Understanding Specialty Memories: Dual–Port RAMs", author unknown, cited on internet web address: http://www.cypress.com/design/techarticles/v2n2p5.html, on Nov. 9, 1999.

*Primary Examiner*—Richard Elms
*Assistant Examiner*—Tuan T. Nguyen
*Attorney, Agent, or Firm*—Philip R. Wadsworth; Charles D. Brown; Bruce W. Greenhaus

[57] ABSTRACT

A read/write electronic memory bank 10, including a plurality of memory units 22–28 and 12–18 which receive a common clock signal having a repetitive clock cycle and have a common input port 20, 21 and a common output port 30, 31. The units function such that in each clock cycle an input word is written to the memory bank 10 from the input port 20, 21 and an output word is read from the memory bank 10 to the output port 30, 31. Each memory unit 22–28 and 12–18 includes a single-port random-access memory (RAM) device 22–28 and a first-in first-out (FIFO) buffer 12–18, such that when the output word is to be read from the same memory unit 22–28 and 12–18 to which the input word is to be written in a given clock cycle, one of the input and output words is passed between the respective port 20, 21, 30, 31 of the memory bank 10 and the FIFO buffer 12–18, instead of between the respective port 20, 21, 30, 31 of the memory bank 10 and the RAM device 22–28.

15 Claims, 3 Drawing Sheets

SIMULTANEOUS ADDRESSING USING SINGLE-PORT RAMS

FIELD OF THE INVENTION

The present invention relates generally to memory devices, and specifically to single-port read/write memory devices.

BACKGROUND OF THE INVENTION

The need to read and write simultaneously to a computer memory device is satisfied by dual-port memory devices, but dual-port memory devices are relatively expensive compared to single-port memory devices. A single-port memory device, such as a static random access memory (SRAM) or a dynamic random access memory (DRAM), can either read or write during any specific time period (typically a single clock cycle), but not both. Methods for simulating a dual-port device using one or more single-port memory devices are well known in the art.

Cypress Semiconductor Corporation, of San Jose, Calif., publish a technical article entitled "Understanding Specialty Memories: Dual-Port RAM," which can be found at:

http://www.cypress.com/design/techarticles/v2n2.html, which is incorporated herein by reference, explaining how a dual-port device can be simulated by using a multiplexer between two access processes addressing a single-port device.

U.S. Pat. No. 5,818,751 to Ho et al., which is incorporated herein by reference, describes a single-port SRAM with no read/write collisions. The invention uses separate read and write cycles from a clock.

U.S. Pat. No. 5,371,877 to Drako et al., which is incorporated herein by reference, describes a circuit for providing the function of a dual port first-in first-out (FIFO) memory stack. The circuit includes a first and second bank of single port RAMs to which data are written in alternation, and wherein each bank, when not being written to, is read from.

U.S. Pat. No. 5,706,482 to Matsushima et al., which is incorporated herein by reference, describes a method by which a single port memory which is used to store an image can be read from and simultaneously written to. The method uses separate read and write buffers communicating to an arbiter section, which in turn communicates with the single port memory.

U.S. Pat. No. 5,802,579 to Crary, which is incorporated herein by reference, describes a system and method for simultaneously reading and writing data in a single-port random access memory. The system stores new data and a corresponding new data address in a buffer, and compares the new data address with a current read address. In the event that the read and write addresses are the same, the new data are stored at a modified address.

SUMMARY OF THE INVENTION

It is an object of some aspects of the present invention to provide improved methods and apparatus for simultaneously writing to and reading from a memory device.

In preferred embodiments of the present invention, a memory bank comprises a plurality of single-port random access memory (RAM) devices. Each RAM communicates with a respective first-in first-out (FIFO) buffer device, and all devices are driven by a single clock. On each cycle of the clock, data are read as a read-word from the memory bank and written as a write-word to the memory bank, according to address requests received from outside read and write agents. The agents may comprise substantially any suitable addressing devices known in the art, and the addresses themselves are typically not known in advance and may comprise random selections. In order to avoid collision when the read- and write-words in a given clock cycle are to be read from and written to the same one of the plurality of RAMs, one of the words is instead written to the corresponding FIFO buffer and is then read from the FIFO buffer on a later clock cycle. Using a plurality of single-port memory devices and FIFOs in this type of configuration is an efficient and inexpensive way to provide a memory bank which can simultaneously read and write data.

In some preferred embodiments of the present invention, the read-word is read on every clock cycle directly from the appropriate RAM, and the FIFO buffer receives the write-word when necessary to avoid collision. In other words, on each cycle of the clock, data as a write-word from the outside agent are either written into a RAM, or are written to a FIFO. The data are written to a specific RAM if the RAM is not being read from, and if the FIFO communicating with the specific RAM is empty. Otherwise, in the case that the specific RAM is being read from, the data and its address are written to the FIFO communicating with the RAM. During each clock cycle, RAMs which are not being read from have data written to them from each of their respective FIFOs, unless the FIFOs are empty of data. Thus, on each clock cycle, data are read from one of the plurality of RAMs, and data are either written to another of the plurality of RAMs or are written to one of the plurality of FIFOs, or both.

There is therefore provided, in accordance with a preferred embodiment of the present invention, a read/write electronic memory bank, including a plurality of memory units, which receive a common clock signal having a repetitive clock cycle and have a common input port and a common output port, such that in each clock cycle an input word is written to the memory bank from the input port and an output word is read from the memory bank to the output port, each memory unit including:

a single-port random-access memory (RAM) device; and a first-in first-out (FIFO) buffer, such that when the output word is to be read from the same memory unit to which the input word is to be written in a given clock cycle, one of the input and output words is passed between the respective port of the memory bank and the FIFO buffer, instead of between the respective port of the memory and the RAM device.

Preferably, the RAM of each memory unit is coupled directly to the output port, and the FIFO of each memory unit is coupled directly to the input port, so that when the output word is to be read from the same memory unit to which the input word is to be written in the given clock cycle, the input word is held in the respective FIFO until a subsequent clock cycle.

Preferably, the memory bank includes a controller which checks if the output word is to be read from the same memory unit to which the input word is to be written in each clock cycle, and which allows the input word to be written from the respective FIFO to the RAM of the memory unit on a clock cycle at which the output word is not read from the unit.

Preferably, each memory unit is assigned a unique allocation of memory addresses in the bank.

Preferably, the plurality of memory units include four memory units, and wherein the memory addresses are allocated among the four units according to two preselected bits of the addresses.

Preferably, the FIFO buffers have a depth equal to a maximum number of output words that can be read in succession from a single one of the memory units in a system in which the memory bank is used.

Preferably, the number of memory units and, for each memory unit, sizes of the FIFO and of the RAM are selected responsive to a simulation of the requirements of an application in which the memory bank is to be used.

There is further provided, in accordance with a preferred embodiment of the present invention, a method for storing data in a memory bank and recalling the stored data therefrom, including:

provide a plurality of memory units each including a single-port random-access memory (RAM) device and a first-in first-out (FIFO) buffer coupled to the RAM device;

driving the plurality of memory units with a clock producing a sequence of clock cycles;

reading a read word from one of the memory units on each of the clock cycles; and writing a write word to one of the memory units on each of the clock cycles, such that when the reading and writing occur to the same memory unit on a common one of the clock cycles, one of the read and write words is passed through the FIFO buffer of the memory unit rather than directly to or from the RAM device of the unit.

Preferably, reading the read word from the one of the memory units includes reading the read word from the RAM comprised in one of the units, and writing the write word to the one of the memory units includes writing the write word to the FIFO included in one of the units.

Preferably, when the reading and writing occur to the same memory unit on the common one of the clock cycles, writing the write word includes holding the write word in the FIFO until a subsequent clock cycle on which the reading occurs from a different memory unit.

Preferably, the method includes checking if the output word is to be read from the same memory unit to which the input word is to be written, and writing the write word directly from the FIFO to the RAM if the output word is to be read from another memory unit.

Preferably, providing the plurality of memory units includes assigning each unit a unique allocation of memory addresses in the bank.

Alternatively or additionally, providing the plurality of memory units includes providing four memory units, wherein the memory addresses are allocated among the four units according to two preselected bits of the addresses.

Preferably, providing the plurality of memory units includes determining a depth of the FIFO buffers responsive to the number of times a single one of the units can be accessed in succession in a system in which the memory bank is used.

Alternatively or additionally, providing the plurality of memory units includes adjusting for each memory unit parameter of the FIFO and of the RAM so as to optimize a performance of the memory bank.

The present invention will be more fully understood from the following detailed description of the preferred embodiments thereof, taken together with the following drawings.

DETAILED DESCRIPTION OF PREFERRED EMBODIMENTS

Figure 1:
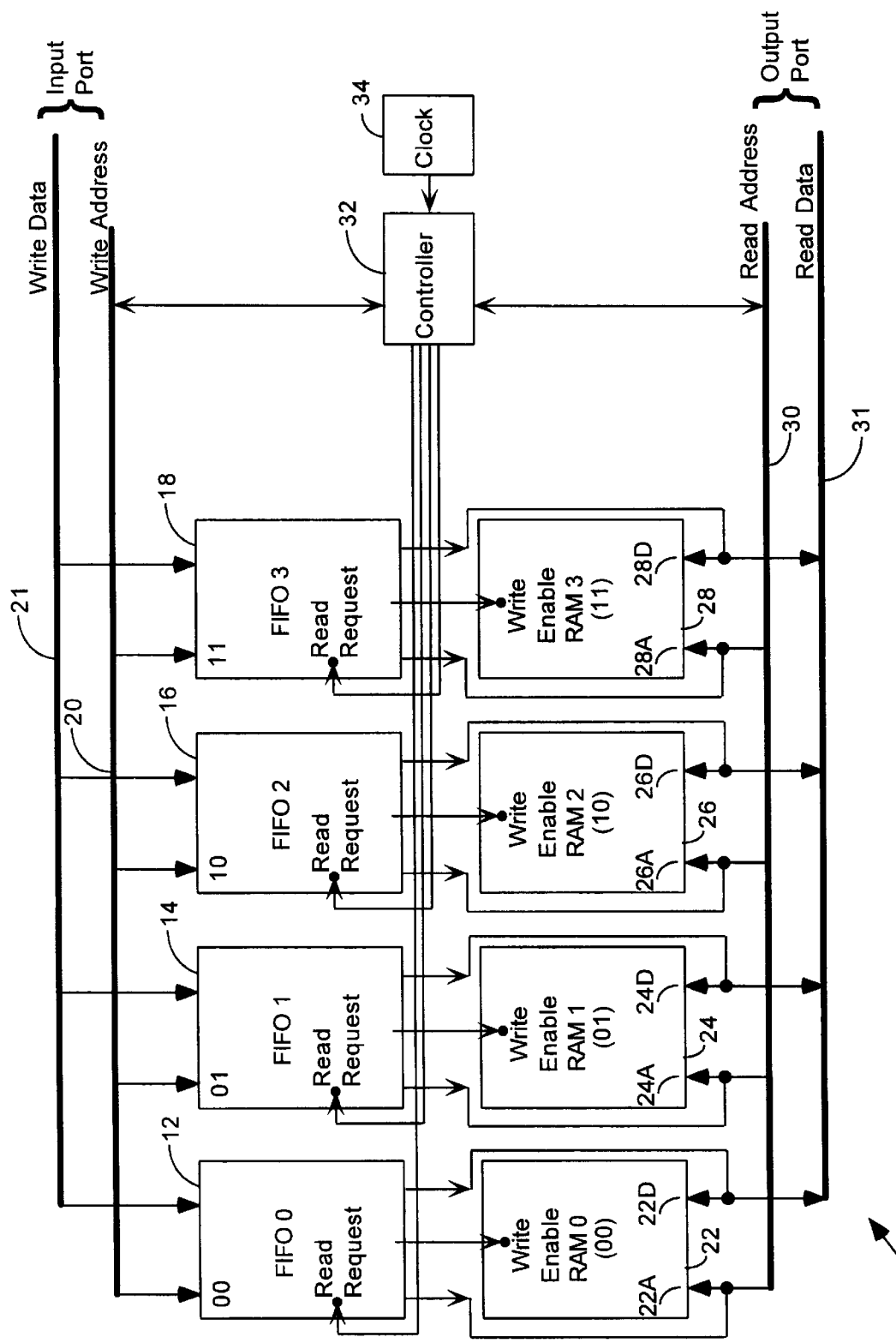
FIG. 1 is a schematic block diagram of a memory system with simultaneous read- and write-addressing, according to a preferred embodiment of the present invention.

Reference is now made to FIG. 1, which is a schematic block diagram of a memory system 10 with simultaneous read- and write-addressing, according to a preferred embodiment of the present invention. In the preferred embodiment described herein, system 10 is utilized as a memory bank for interleaving and de-interleaving of data in a decoder that forms a part of a communication system, but system 10 can equally be used for any other device needing simultaneous read- and write-addressing.

System 10 comprises a plurality, preferably four, first-in first-out (FIFO) buffer devices 12, 14, 16, and 18, as are known in the art. Most preferably, the FIFO devices are synchronous. System 10 also comprises a plurality (corresponding to the number of FIFO devices) of single-port random access memory (RAM) devices 22, 24, 26, and 28, each coupled to a respective FIFO. The RAM devices receive input data and address information from their respective FIFOs. As explained in more detail below, each RAM and its associated FIFO acts as a memory unit. System 10 further comprises a controller 32, whose function is likewise described in more detail below.

RAM devices 22, 24, 26, and 28 are preferably implemented so that the lower two address bits of each RAM unit are preset to 00, 01, 10, and 11 respectively. Similarly, each respective FIFO is preset so as to only receive data corresponding to one of the four lower addresses of 00, 01, 10, or 11. In other words, data to be stored in system 10 are distributed among the RAM devices according to the two least-significant bits (LSBs) in the address, so that sequentially-addressed data are written to or read from the four devices in sequence. Alternatively, the data may be distributed among the RAM according to a different choice of the bits, for example, according to the most-significant address bits, or other addressing criteria such as a function of the addresses. It is noted, however, that no particular data sequencing is required, and system 10 responds to read- and write-addresses, received from an external addressing agent, which are not known in advance and may be random.

Preferably, each RAM has 2K addresses, although any other standard-size RAM could be used and the RAMs do not need to be identical. Thus in the case of 2K×6 bit RAMs, system 10 comprises a total RAM of 8K consecutive addresses. Preferably, data stored at each of the addresses are 6 bits wide, although any other size data that can be stored by the RAMs could be used. RAM devices 22, 24, 26, and 28 comprise respective address ports 22A, 24A, 26A, and 28A which are coupled to a read address bus 30, and respective data ports 22D, 24D, 26D, and 28D which are coupled to a read data bus 31. Busses 30 and 31 together act as an output port for system 10, and have widths corresponding to the addresses and data of the RAMs, so that for four 2K×6 RAMs, read address bus 30 is 13 bits wide and read data bus 31 is 6 bits wide.

Each FIFO stores data, and the address of the data, to be written to its respective RAM device. The FIFOs receive data and the address of the data as a sample from a write data bus 21 and a write address bus 20, which together act as an input port for system 10. The maximum number of samples a FIFO needs to hold, herein termed the depth of the FIFO, is preferably determined by simulation, as described below, based on the requirements of the application in which system 10 is used, and it will be appreciated that the FIFOs do not need to be identical. The widths of busses 20 and 21 are equal to the widths of busses 30 and 31 respectively. As described in more detail below, each FIFO writes data to appropriate addresses in its respective RAM via the data and address ports of the RAM.

The plurality of FIFO devices and/or the plurality of RAM devices and/or controller 32 may be implemented using discrete devices, or as custom or semi-custom integrated circuits, most preferably all on one chip.

System 10 is required to read data from an address in one of the plurality of RAMs, via busses 30 and 31, in each cycle of a clock 34 driving controller 32. System 10 is also required to write data in each clock cycle via busses 20 and 21, the data to be stored at an address in one of the plurality of RAMs. In order to accomplish this using single-port RAMs 22, 24, 26, and 28, a RAM is only written to on a given clock cycle, from its respective FIFO, if the RAM is not being read from on that clock cycle. The check whether or not a RAM is being read from is performed by controller 32.

Figure 2:
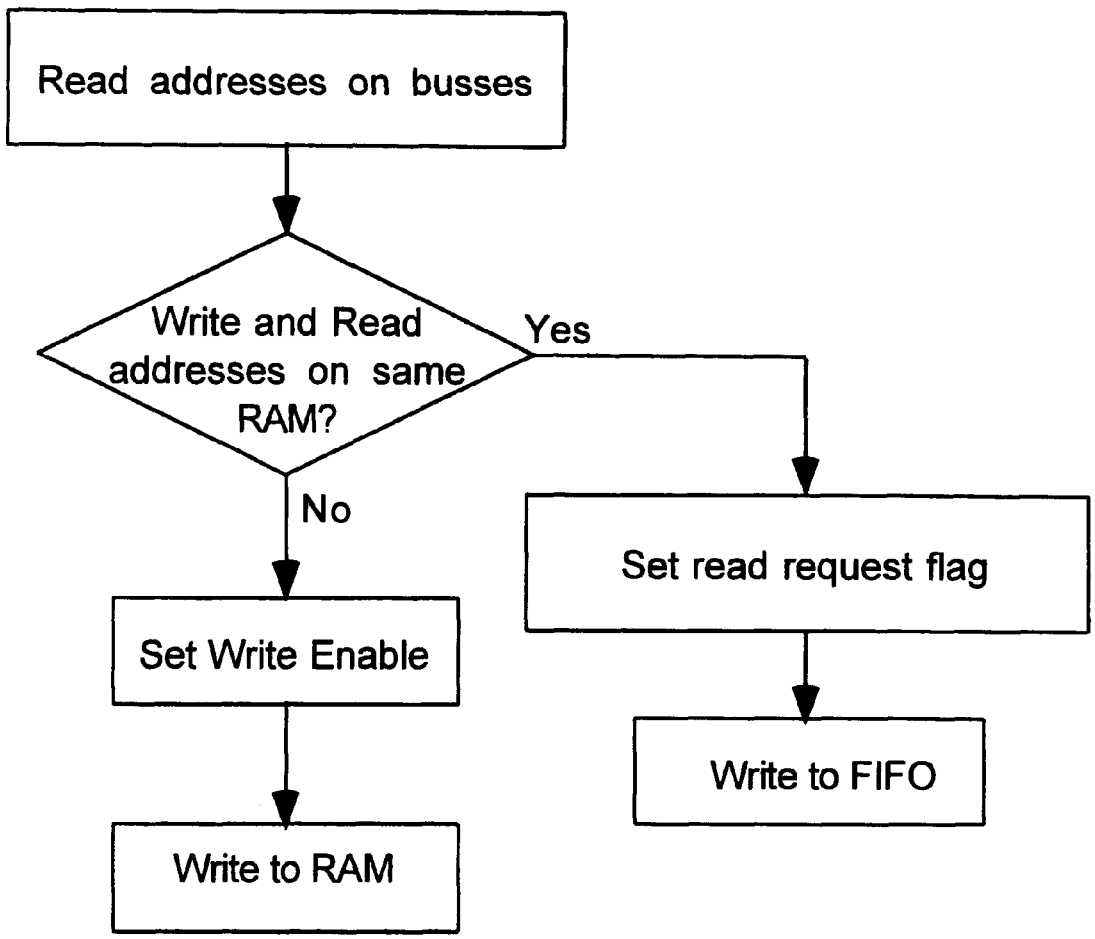
FIG. 2 is a flow chart showing steps performed by the system of FIG. 1, according to a preferred embodiment of the present invention.

FIG. 2 is a flow chart showing steps performed by system 10, according to a preferred embodiment of the present invention. At each clock cycle, controller 32 reads the addresses on write address bus 20 and read address bus 30. Controller 32 compares the addresses, and if the addresses correspond to the same one of the RAMs, i.e., if the addresses have the same two LSBs, so that implementing the read and write requests would mean reading and writing simultaneously from the same RAM, a read request flag of the FIFO corresponding to the RAM is set. In this case, data written to system 10, and the address for the data, are stored in the FIFO. If the addresses do not correspond to the same RAM, the read request flag of the FIFO is not set. The FIFO then sets a write enable flag for its respective RAM, and the FIFO writes data from the FIFO to the RAM at the corresponding address. Data are written if there are data in the FIFO, or if the FIFO has data written to it from busses 20 and 21 during the given clock cycle. Thus data written to system 10 are either stored in a FIFO for later transfer to the respective RAM if the RAM is being read from, or are written to the RAM if the RAM is not being read from.

Figure 3:
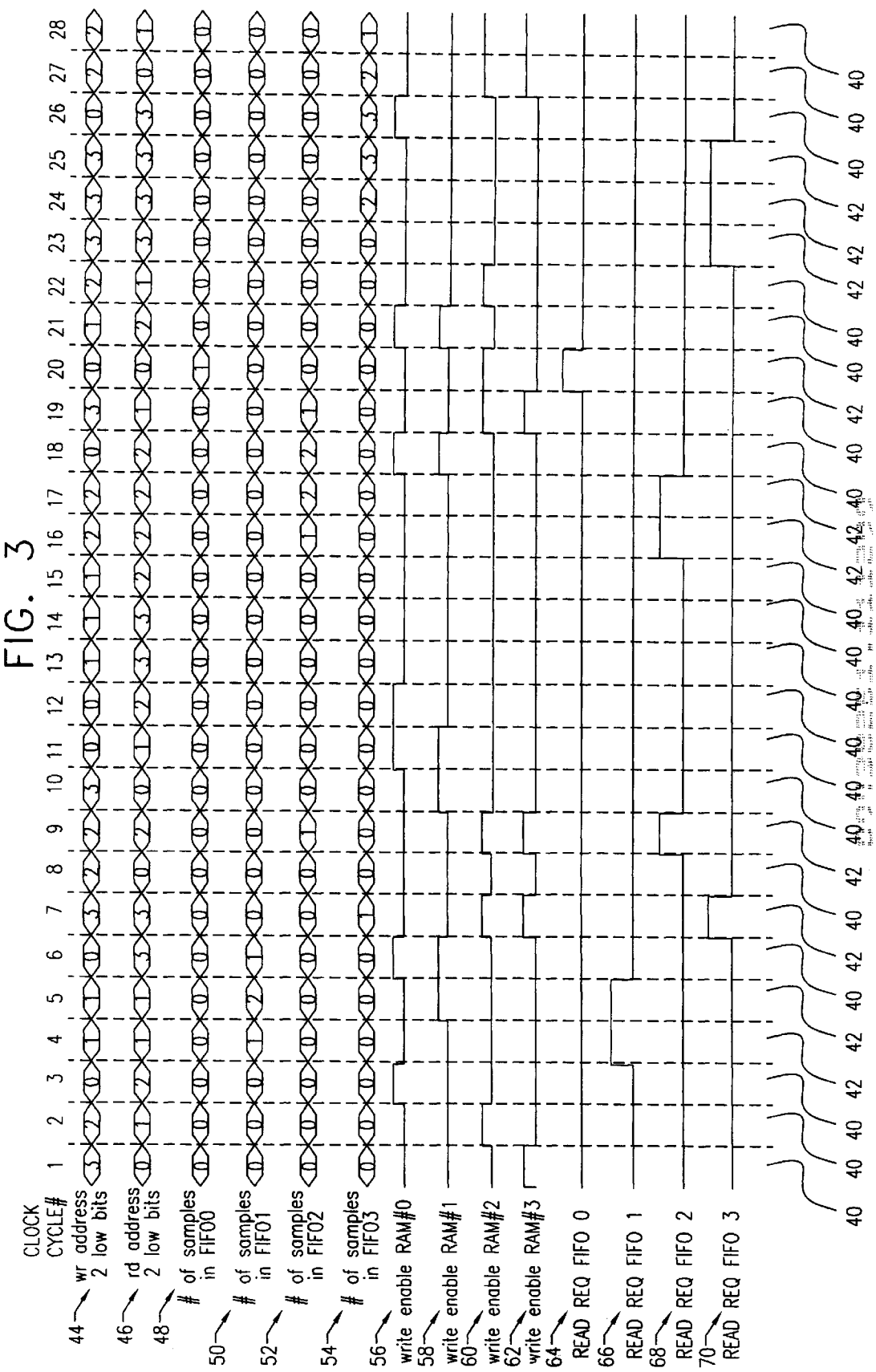
FIG. 3 is a schematic timing diagram showing states and timing signals for the system of FIG. 1, according to a preferred embodiment of the present invention.

FIG. 3 is a schematic timing diagram showing states and timing signals for system 10, according to a preferred embodiment of the present invention. FIG. 3 is divided into columns, each column corresponding to a clock cycle wherein each column is arbitrarily numbered from 1 to 28 for convenience. A row 44 shows the value of the lowest two bits of the write address, and a row 46 shows the value of the lowest two bits of the read address, during operation of system 10. Rows 48, 50, 52, and 54 show the number of samples stored in FIFOs 12, 14, 16, and 18 respectively. Rows 56, 58, 60, and 62 show when the write enables to RAMs 22, 24, 26, and 28 are set, respectively. Rows 64, 66, 68, and 70 show when the read request flags to FIFOs 12, 14, 16, and 18 are set, respectively.

In a plurality of clock cycles 40, the lowest two bits of the corresponding read and write addresses are different. Thus, during cycles 40 the write enable flag for the RAM corresponding to the write address is set, and data are written into the RAM. In other cycles 42, the lowest two bits of the read and write addresses are the same. Thus, during cycles 42 the read request for the appropriate FIFO is set and no write enable flag is set, and data are written into the appropriate FIFO. Columns 4 and 5 and columns 23, 24, and 25 show examples of RAMs being consecutively unavailable for having data written into the RAM, so that the respective FIFOs in each case initially increase the number of samples stored therein. When a specific RAM is not being read from, the number of samples in its respective FIFO is reduced, by writing a sample into the RAM on each clock cycle. For example, columns 6 and 7 illustrate a decrease for FIFO 1 as it writes to RAM 1, and columns 19 and 20 illustrate a decrease for FIFO 2 as it writes to RAM 2.

In some preferred embodiments of the present invention, system 10 is utilized as a memory bank within an interleaver control which manages the interleaving and/or deinterleaving of packet data transferred in a communication system, such as a cellular telephone system. The interleaver control generates pseudo-random read and write addresses, among other things, in order to implement the control process. In order to find the depth of each FIFO, a simulation is run covering all possible packet sizes, and all possible values of other variables involved in the packet transfer. If the simulation shows, for example, that no FIFO ever has more than 10 samples within the FIFO at any time, then the depth required for each FIFO in system 10 needs to be no more than 10. In order to use a simultaneous addressing system as described above in other applications, those skilled in the art will be able to devise corresponding simulations in order to find the necessary depth of the FIFOs involved in the system.

It will be apparent that, regardless of the application in which the simultaneous addressing system is used, if the number of RAMs within the system is increased (and correspondingly the number of FIFOs), for example to eight, the depth of each of the FIFOs can be decreased. Likewise, in an alternative embodiment, only two RAMs and two FIFOs are used. Thus, depending upon the application, parameters such as the number of RAMs and FIFOs and the depth of the individual FIFOs and the size of the individual RAMs can be varied to develop optimal values of the number and size of RAMs and of the depth of the FIFOs. Preferably, the parameters are varied in a simulation in order to optimize the performance of the system.

While in the preferred embodiments described above, data are read directly from the plurality of RAMs, and are written to the RAMs via a plurality of FIFOs, it will be appreciated that all simultaneous addressing systems comprising a plurality of memory units, each unit having a RAM and a communicating FIFO as described above, are to be considered as being within the scope of the present invention.

It will thus be appreciated that the preferred embodiments described above are cited by way of example, and the full scope of the invention is limited only by the claims.

We claim:

1. A read/write electronic memory bank, comprising a plurality of memory units, which receive a common clock signal having a repetitive clock cycle and have a common input port and a common output port, such that in each clock cycle an input word is written to the memory bank from the input port and an output word is read from the memory bank to the output port, each memory unit comprising:

a) a single-port random-access memory (RAM) device; and b) a first-in first-out (FIFO) buffer, such that when the output word is to be read from the same memory unit to which the input word is to be written in a given clock cycle, one of the input and output words is passed between the respective port of the memory bank and the FIFO buffer, instead of between the respective port of the memory bank and the RAM device.

2. A memory bank according to claim 1, wherein the RAM of each memory unit is coupled directly to the output port, and the FIFO of each memory unit is coupled directly to the input port, so that when the output word is to be read from the same memory unit to which the input word is to be written in the given clock cycle, the input word is held in the respective FIFO until a subsequent clock cycle.

3. A memory bank according to claim 2, and comprising a controller which checks if the output word is to be read from the same memory unit to which the input word is to be written in each clock cycle, and which allows the input word to be written from the respective FIFO to the RAM of the memory unit on a clock cycle at which the output word is not read from the unit.

4. A memory bank according to claim 1, wherein each memory unit is assigned a unique allocation of memory addresses in the bank.

5. A memory bank according to claim 4, wherein the plurality of memory units comprise four memory units, and wherein the memory addresses are allocated among the four units according to two preselected bits of the addresses.

6. A memory bank according to claim 1, wherein the FIFO buffers have a depth equal to a maximum number of output words that can be read in succession from a single one of the memory units in a system in which the memory bank is used.

7. A memory bank according to claim 1, wherein the number of memory units and, for each memory unit, sizes of the FIFO and of the RAM are selected responsive to a simulation of the requirements of an application in which the memory bank is to be used.

8. A method for storing data in a memory bank and recalling the stored data therefrom, comprising:
   a) providing a plurality of memory units each comprising a single-port random-access memory (RAM) device and a first-in first-out (FIFO) buffer coupled to the RAM device;
   b) driving the plurality of memory units with a clock producing a sequence of clock cycles;
   c) reading a read word from one of the memory units on each of the clock cycles; and
   d) writing a write word to one of the memory units on each of the clock cycles, such that when the reading and writing occur to the same memory unit on a common one of the clock cycles, one of the read and write words is passed through the FIFO buffer of the memory unit rather than directly to or from the RAM device of the unit.

9. A method according to claim 8, wherein reading the read word from the one of the memory units comprises reading the read word from the RAM comprised in one of the units, and wherein writing the write word to the one of the memory units comprises writing the write word to the FIFO comprised in one of the units.

10. A method according to claim 9, wherein when the reading and writing occur to the same memory unit on the common one of the clock cycles, writing the write word comprises holding the write word in the FIFO until a subsequent clock cycle on which the reading occurs from a different memory unit.

11. A method according to claim 9, and comprising checking if the output word is to be read from the same memory unit to which the input word is to be written, and writing the write word directly from the FIFO to the RAM if the output word is to be read from another memory unit.

12. A method according to claim 8, wherein providing the plurality of memory units comprises assigning each unit a unique allocation of memory addresses in the bank.

13. A method according to claim 12, wherein providing the plurality of memory units comprises providing four memory units, and wherein the memory addresses are allocated among the four units according to two preselected bits of the addresses.

14. A method according to claim 8, wherein providing the plurality of memory units comprises determining a depth of the FIFO buffers responsive to the number of times a single one of the units can be accessed in succession in a system in which the memory bank is used.

15. A method according to claim 8, wherein providing the plurality of memory units comprises selecting the number of memory units and, for each memory unit, sizes of the FIFO and of the RAM, responsive to a simulation of the requirements of an application in which the memory bank is to be used.

* * * * *